United States Patent [19]

Heightley et al.

[11] 4,363,111
[45] Dec. 7, 1982

[54] DUMMY CELL ARRANGEMENT FOR AN MOS MEMORY

[76] Inventors: John D. Heightley, 3150 Monument Lake Rd., Monumet, Colo. 80132; Sargent S. Eaton, Jr., 3361 Springridge Cir., Colorado Springs, Colo. 80906

[21] Appl. No.: 194,614

[22] Filed: Oct. 6, 1980

[51] Int. Cl.³ .............................................. G11C 7/00
[52] U.S. Cl. ..................................... 365/210; 365/205
[58] Field of Search ................ 365/205, 207, 208, 210

[56] References Cited
U.S. PATENT DOCUMENTS 3,760,381  9/1973  Yao ..................................... 365/205

*Primary Examiner*—George G. Stellar

[57] ABSTRACT

A dummy cell arrangement is described for sensing the logic state of an accessed memory cell in an MOS memory in which a memory cell capacitor of a given size is associated with each memory cell. In the preferred embodiment, a plurality of dummy cells are included, each of which has a dummy capacitor of substantially the same given size as a memory cell capacitor. When the state of an accessed memory cell is to be sensed, its memory cell capacitor is coupled to a bit line to change the voltage thereon and a selected dummy cell capacitor is coupled to a pair of bit lines so as to effect substantially equal transfers of charge between the dummy capacitor and the bit lines to which it is coupled. The resulting voltage on the memory cell capacitor's bit line is compared to the voltage on one of the dummy capacitor's bit lines so as to determine the logic state of the accessed memory cell.

10 Claims, 1 Drawing Figure

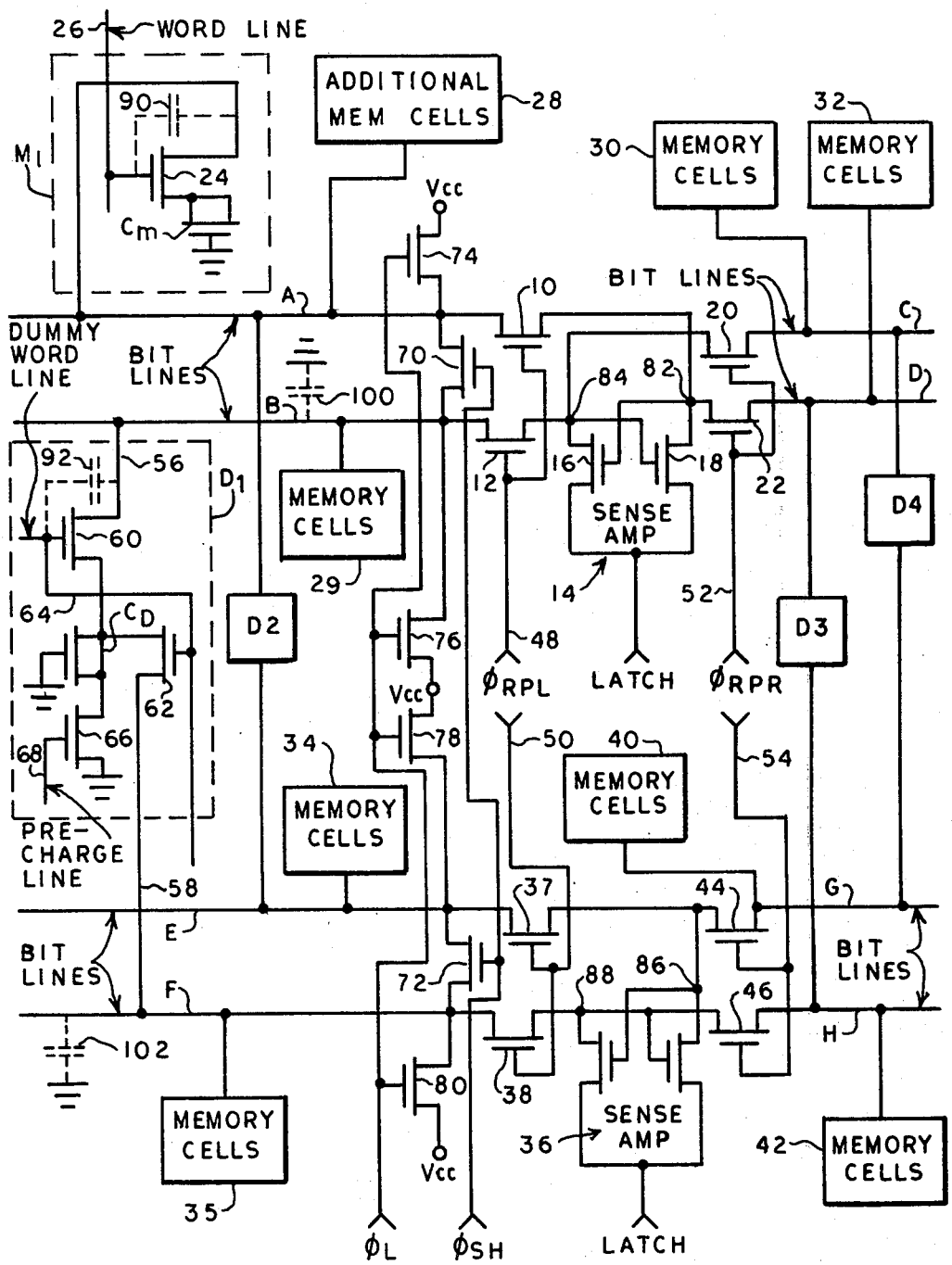

DUMMY CELL ARRANGEMENT FOR AN MOS MEMORY

BACKGROUND OF THE INVENTION

The present invention relates generally to improvements in MOS (metal oxide semiconductor) memories, and in particular to a so-called "dummy cell" arrangement for sensing the logic state of a memory cell.

In MOS memories of the type considered herein, logical data is stored in a matrix of memory cells, each of which includes a cell capacitor for storing a charge which indicates whether its cell is in a logic 1 or a logic 0 state. A large number of such memory cells are typically associated with each of the memory's bit lines.

A number of "dummy cells" are also included in the memory. Each of these latter type of cells includes a dummy capacitor which is conventionally one-half the size of a memory cell capacitor and which is precharged to a reference voltage level. To sense the state of an addressed memory cell, the charge on the memory's cell capacitor is dumped on a first bit line and the charge on the dummy cell's capacitor is dumped on a second bit line. The resultant difference in voltage on the two bit lines is used as an indication of whether the memory cell is in a logic 1 or a logic 0 state.

A drawback of the conventional dummy cell arrangement described above is that, as memory cell capacitors are reduced in size, it is difficult to build a dummy cell capacitor which is one-half the size of the memory cell capacitor. Manufacturing variables which cause the size of a memory cell capacitor to vary by a given amount generally result in a similar change in the size of the dummy capacitor rather than one-half the change. Hence, their two-to-one size relationship changes.

For the foregoing reasons, conventional dummy cell arrangements become increasingly unreliable as the size of memory cell capacitors is reduced.

OBJECTS OF THE INVENTION

It is a general object of the invention to provide an improved dummy cell arrangement for an MOS memory.

It is a more specific object of the invention to provide a dummy cell arrangement in which the sizes of dummy capacitors are not only more easily controlled but also track with size variations in the memory cell capacitors.

BRIEF DESCRIPTION OF THE FIGURE

The objects stated above and other objects of the invention are set forth with more particularity in the following detailed description and in the sole FIGURE which illustrates a dummy cell arrangement according to the invention.

DESCRIPTION OF THE PREFERRED EMBODIMENT

Referring to the FIGURE, a representative portion of a dynamic MOS memory is shown which includes a preferred form of a dummy cell arrangement. The illustrated structure includes four pair of bit lines identified as A-B, C-D, E-F and G-H. The pair of bit lines A-B is coupled through transistors 10 and 12 to a sense amplifier 14. A second pair of bit lines C-D is similarly coupled to the sense amplifier 14. With this so-called "multiplexed folded bit line" arrangement, the sense amplifier 14 is adapted to sense the potentials on bit lines A and B or on bit lines C and D. The bit line pairs E-F and G-H are connected in a similar arrangement with another sense amplifier. As described in detail below, one of the bit lines (A, for example) is coupled to a capacitor associated with an addressed memory cell so that a charge transfer occurs between that bit line and the latter capacitor. The other bit line in that pair (B, for example) carries a reference voltage induced by a dummy cell capacitor. The sense amplifier 14 detects the voltage difference between both bit lines and latches in a state which is indicative of the state of the addressed memory cell.

Referring now specifically to the sense amplifier 14, it includes transistors 16 and 18 which are interconnected as a flip-flop. As shown, the source of the transistor 12 is coupled to the drain of the transistor 16 and to the gate of the transistor 18. The source of the transistor 10 is coupled to the drain of the transistor 18 and to the gate of the transistor 16.

The bit lines C and D are coupled via transistors 20 and 22 to the sense amplifier 14 such that the source of the transistor 20 is coupled to the drain of transistor 16 and to the gate of transistor 18, and such that the source of transistor 22 is coupled to the drain of transistor 18 and to the gate of transistor 16. With this arrangement, either the transistor pair 10-12 or the transistor pair 20-22 may be turned on to couple the sense amplifier either to bit lines A and B or to bit lines C and D. When the amplifier 14 is enabled by a low level latch signal applied to the sources of transistors 16 and 18, the amplifier detects the voltage differential between the bit lines A and B (or C and D) and latches in a state indicative of the logic level associated with an addressed memory cell which feeds one of the bit lines.

Shown coupled to the bit line A is an exemplary memory cell M1 which includes a transistor 24 and a memory cell capacitor $C_M$. As is conventional, this capacitor stores a charge which is indicative of the logic state of the cell M1. A word line 26 is driven to a high level when the cell M1 is addressed so as to turn on the transistor 24 and thereby couple the capacitor $C_M$ to the bit line A. Additional memory cells 28, each similar to the cell M1, are also associated with the bit line A and may be coupled thereto when addressed by their own word lines. Likewise, memory cells groups 29, 30 and 32 are associated with bit lines B, C, and D, respectively, and may be selectively coupled to their associated bit lines when addressed by their own word lines.

Referring to the bit lines E and F, they are associated with groups of memory cells 34 and 35, respectively, and are coupled to a sense amplifier 36 via transistors 37 and 38. Bit lines G and H are associated with groups of memory cells 40 and 42, respectively, and are coupled to the sense amplifier 36 (constructed similarly to the sense amplifier 14) via transistors 44 and 46. Suffice it to say that the groups 34, 35, 40 and 42 of memory cells all contain individual memory cells similar to the memory cell M1 and are addressed in a similar manner. In addition, the sense amplifier 34 senses the voltage differential between bit lines E and F or between the bit lines G and H, depending on whether transistors 37-38 are energized or whether transistors 44-46 are energized.

To select which pairs of bit lines are sensed, a clock signal indicated as $\phi_{RPL}$ is coupled via leads 48 and 50 to the gates of transistors 10, 12, 37 and 38, and another clock signal indicated as $\phi_{RPR}$ is coupled via leads 52 and 54 to the gates of transistors 20, 22, 44 and 46. If bit lines A and B are to be sensed by the amplifier 14 and bit lines E and F are to be sensed by the amplifier 36, the clock signal $\phi_{RPR}$ is brought low and the clock signal $\phi_{RPL}$ is held high (above Vcc). Consequently, transistors 10 and 12 are turned on to couple the bit lines A and B to the sense amplifier 14, and transistors 37 and 38 are turned on for coupling the bit lines E and F to the sense amplifier 36. Transistors 20, 22, 44 and 46 are, of course, held off to decouple the bit lines C, D, G and H from the sense amplifiers 14 and 36.

Assuming now that the memory cell M1 is addressed, its memory capacitor $C_M$ is coupled to the bit line A via the transistor 24. Thus, a transfer of charge occurs between the latter capacitor and the bit line A, thereby altering the voltage level on that bit line. In addition, a dummy capacitor, of the same size as the capacitor $C_M$ and precharged to a selected voltage level, is coupled to the bit line B and to another bit line (F, for example) such that the capacitance associated with the dummy capacitor effects substantially equal transfers of charge between itself and the bit lines to which it is coupled. Thus, the charge of the dummy capacitor is split between both bit lines. Then the voltage on the bit line A is compared by the sense amplifier 14 with the voltage on the bit line B to determine the logic state of the memory cell M1.

In the illustrated embodiment, a dummy cell D1 is shown coupled between bit lines B and F via leads 56 and 58. The cell D1 includes a dummy cell capacitor $C_D$ whose size is selected to be substantially equal to the size of the memory cell capacitor $C_M$. The capacitor $C_D$ is adapted to be coupled to the bit line B by a transistor 60, and is adapted to be coupled to the bit line F by another transistor 62. The latter transistors are turned on simultaneously when a high level signal is applied to a dummy word line 64. In addition, a transistor 66 has its drain coupled to the capacitor $C_D$, its source coupled to ground, and its gate coupled to a precharge line 68. Thus, when the line 68 is driven high, the transistor 66 conducts to precharge the capacitor $C_D$ to zero volts.

A dummy cell D2, similar to the dummy cell D1, and activated by its own precharge and word lines (not shown), is coupled between the bit lines A and E. Likewise, similar dummy cells D3 and D4 are coupled between bit lines D-H and C-G, respectively.

Before describing the operation of the dummy cells, it should be pointed out that the illustrated arrangement will normally include means for equilibrating and precharging all the bit lines. For example, transistors 70 and 72 may be coupled between bit line pairs A-B and E-F, respectively, for shorting together bit lines A and B and bit lines E and F in response to a clock signal designated as $\phi_{SH}$. To precharge the bit line A to a potential near Vcc, a transistor 74 is coupled to Vcc via its drain, to the bit line A via its source, and to precharge clock signal $\phi_L$ via its gate. Thus, when the signal $\phi_L$ goes high, the transistor 74 conducts to pull the potential of bit line A nearly to Vcc. In a similar manner, bit lines B, E and F are precharged by transistors 76, 78 and 80 in response to the signal $\phi_L$.

The bit lines C, D, G and H will also normally be coupled to precharging and equilibrating transistors (not shown) in the same manner as bit lines A, B, E and F.

The operation of the dummy cell arrangement is best described by assuming that it is desired to sense the state of the memory cell M1 and one of the memory cells in the group 34. In the preferred operating mode, the clock signal $\phi_{SH}$ is first driven high to turn on the transistors 70 and 72 so that the bit line pairs A-B and E-F are equilibrated. The clock signal $\phi_L$ is then driven high to turn on the transistors 74, 76, 78 and 80 so that bit lines A, B, E and F are precharged to a voltage near Vcc. The dummy precharge line 68 is also driven high to ensure that the voltage across the capacitor $C_D$ is equal to zero.

In response to an incoming word address, the memory drives the word line 26 high to turn on the transistor 24 and couple the capacitor $C_M$ to the bit line A. (Another word line will ordinarily be driven high to couple another memory capacitor in the group 34 to the bit line E.) In addition, the dummy word line 64 is driven high to turn on the transistors 60 and 62, thereby coupling the capacitor $C_D$ to the bit lines B and F.

Assuming for example, that the capacitor $C_M$ had been previously charged to Vcc, no transfer of charge will occur between that capacitor and the bit line A. However, the zero volt precharge potential on the capacitor $C_D$ results in a charge transfer between the bit lines B and F and the capacitor $C_D$. Consequently, a voltage differential is developed between the bit lines A and B.

In the case where the capacitor $C_M$ had been previously charged to zero volts, the latter capacitor charges toward Vcc. Even though the capacitor $C_D$ also charges toward Vcc, the charge transfer which occurs between the bit line B and the capacitor $C_D$ is only one-half the charge transfer which occurs between the bit line A and the capacitor $C_M$. Consequently, a voltage differential, equal in magnitude but opposite in polarity to the previous example, is developed between the bit lines A and B. Similar voltage differentials are developed between the bit lines E and F as a result of a memory capacitor in the bit lines E and F as a result of a memory capacitor in the group 34 being coupled to the bit line E.

To sense the voltage differential between the bit lines A and B and between E and F, the clock signal $\phi_{RPL}$ is held high while the clock signal $\phi_{RPR}$ is driven low. Consequently, the transistors 10 and 12 conduct to couple the bit lines A and B to the sense amplifier 14. The latter amplifier is enabled by the negative-going latch signal received at the sources of transistors 16 and 18.

To explain the operation of the sense amplifier 14 in more detail, it is assumed that Vcc equals 5 volts, that all bit lines are precharged to 5 volts, and that the voltage across the capacitor $C_M$ equals zero volts. As stated above, the voltage across the dummy cell capacitor $C_D$ is also equal to zero volts.

When the capacitor $C_M$ is coupled to the bit line A, the voltage on the latter bit line drops to about 4.8 volts. When the capacitor $C_D$ is coupled to bit lines B and F, the voltage on those bit lines drops only to about 4.9 volts because the charge on capacitor $C_D$ is equally divided between the bit lines B and F.

When the sense amplifier 14 is enabled by the low level latch signal, the transistor 18 turns on before transistor 16 because its gate voltage (4.9 volts) is higher than the voltage (4.8 volts) on the gate of transistor 16. Consequently, the voltage at the drain of transistor 18 (node 82) is pulled low (to about zero volts) and the voltage at the drain of transistor 16 (node 84) remains high (at 4.9 volts). Thus, the one tenth volt differential between bit lines A and B has been converted by the sense amplifier 14 to almost a 5 volt differential between nodes 82 and 84. This differential voltage, indicative of the memory cell M1 being in a logic zero state, may be coupled to data lines (not shown) in the usual manner.

Had the capacitor $C_M$ been charged to 5 volts (indicative of a logic 1 state) when it was coupled to bit line A, the potential on that bit line would have remained at 5 volts. Hence, the transistor 16 would have turned on, the transistor 18 would have remained off, and the potentials at nodes 82 and 84 would have been driven to 5 volts and zero volts, respectively, thereby indicating that the cell M1 is in a logic 1 state.

While the sense amplifier 14 detects the voltage differential between bit lines A and B, the sense amplifier 36 detects the voltage differential between bit lines E and F in the manner described above. Specifically, if the addressed memory cell in the group 34 is in a logic zero state while the capacitor $C_D$ lowers the voltage on bit line F to about 4.9 volts, the sense amplifier 36 generates a low level signal at its node 86 and a high level signal at its node 88. Conversely, if the addressed memory cell is in a logic 1 state, the amplifier 36 generates a high level signal at node 86 and a low level signal at node 88. Both such nodes may be coupled to another pair of data lines in the conventional manner.

A primary advantage of the illustrated dummy cell arrangement is that each dummy cell capacitor is as large as each memory cell capacitor. Hence, the problems associated with manufacturing a half size dummy capacitor are avoided.

Another advantage resides in the fact that manufacturing variables which tend to change the size of the memory cell capacitors will change the size of the dummy cell capacitors by the same percentage. Hence, the 1:1 size relationship between the dummy cell capacitors and the memory cell capacitors is maintained.

Another factor to be considered in the design of a dummy cell is the total charge transfer which occurs between the dummy cell capacitor and its bit line, on the one hand, and between the memory cell capacitor and its bit line, on the other hand. Preferably, a charge of Q will be transferred between the capacitor $C_M$ and the bit line A while a charge of one-half Q will be transferred between the capacitor $C_D$ and the bit line B (Q equals the value of the capacitor $C_M$ times the voltage to which it becomes charged). In the present embodiment, a 2:1 ratio in such charge transfer is effected by applying the same high level potential, 5 volts, for example, to the word line 26 and to the dummy word line 64.

To explain this operation, assume that the word line 26 is driven to a level of 7 volts and that the bit lines A and B are precharged to 5 volts. Irrespective of the higher voltage on the word line 26, the capacitor $C_M$ receives from the bit line A a charge Q equal to only $C_M$ times 5 volts. If the dummy word line 64 is driven to a potential of 5 volts, the dummy capacitor $C_D$ receives from the bit line B a charge equal to one-half $C_D$ times 4 volts because of the threshold voltage associated with the transistor 60. The resultant ratio of charge transfer from bit lines A and B would be 5:2 rather than 2:1 and would have the same undesirable effect as having unequal values for the capacitors $C_M$ and $C_D$. By driving the word lines 26 and 64 to equal potentials, 5 volts, for example, a 2:1 charge transfer ratio is effected.

The use herein of equal potentials for the word lines 26 and 64 has another beneficial result. As indicated by the dashed lines in the drawing, the transistor 24 includes gate-to-drain capacitance 90, and the transistor 60 includes gate-to-drain capacitance 92. If the word lines 26 and 64 are driven high to equal potentials, and the capacitances 90 and 92 are substantially equal, then the capacitances 90 and 92 will couple equal values of charge to the bit lines A and B from the word lines 26 and 64 when the latter are driven high, thereby retaining the desired balance between the bit lines A and B.

Another factor to be taken into account is the total capacitance associated with the bit lines. This capacitance is represented, in the case of bit lines B and F, by capacitances 100 and 102, respectively. Because the capacitances 100 and 102 will ordinarily be of unequal value, unequal charge transfers will occur between the dummy cell capacitor $C_D$ and bit line B on the one hand, and between the capacitor $C_D$ and bit line F on the other hand. To compensate for the inequality between capacitances 100 and 102, the dummy word line 64 is driven with a voltage which causes transistors 60 and 62 to act as constant current sources for transferring charge equally between the capacitor $C_D$ and the bit lines B and F.

In the present embodiment, the dummy word lines are driven to a voltage no greater than Vcc (5 volts, for example). Consequently, the charging current flowing through the transistor 60 is substantially equal to the charging current flowing through the transistor 62, and substantially equal charge transfer occurs between the capacitor $C_D$ and the bit lines B and F. Stated another way, the charging current through transistors 60 and 62 is made to be independent of voltage differences on bit lines B and F which are attributable to differences between the values of capacitances 100 and 102.

It will be appreciated that the dummy word line 64 must be driven low at an appropriate time to isolate the dummy cell D1 from the bit lines to which it is coupled. The relative timing between the dummy word line 64 being driven low and the latch signal being driven low is another aspect of the present dummy cell arrangement. As will be shown, it is preferred that the dummy word line 64 be driven low no sooner than the latch is driven low.

Consider the situation wherein the states of the various addressed memory cells cause the bit line B to be at a high level while the bit line F is at a low level. As shown in the FIGURE, transistors 60 and 62 in the dummy cell D1 are serially coupled between the bit lines B and F. To avoid shorting the high level potential on bit line B to the low level potential on bit line F, the potential on the dummy word line 64 is driven low to turn off the transistors 60 and 62 at the same time or slightly later than the latch signal is driven low, thereby isolating bit line B from bit line F before the sense amplifier 14 latches. If the transistors 60 and 62 are on when the sense amplifier 14 latches, the potentials on bit lines B and F will be upset and possibly cause the sense amplifier to latch in the wrong state. It has been found that a delay of about 2 nanoseconds between the latch going low and the dummy word line going low provides satisfactory operation.

Yet another reason for driving the dummy word line low no sooner than the latch is driven low has to do with the gate-to-drain capacitance 92 of the transistor 60. If the dummy word line 64 is driven low before the sense amplifier 14 is latched, the capacitance 92 couples, from the bit line B to the dummy word line 64, the charge it had previously transferred to the bit line B. This, of course, would upset the constant 2:1 charge ratio on the bit lines A and B, since word line 26 coupled a charge to bit line A through gate to drain capacitance 90.

With the dummy cell arrangement described above, a more reliable and more easily manufactured MOS memory is obtained. The dummy capacitors are manufactured as easily as the memory cell capacitors, and the sizes of both types of capacitors tend to track, irrespective of processing variables. Consequently, the sense amplifiers develop outputs which accurately reflect the states of addressed memory cells.

Although the invention has been described in terms of a preferred structure, it will be obvious to those skilled in the art that many alterations and modifications may be made without departing from the invention. Accordingly, it is intended that all such alterations and modifications be included within the spirit and scope of the invention as defined by the appended claims.

What is claimed is:

1. In an MOS memory having a plurality of memory cells each having a memory cell capacitor of a given size which is adapted to be charged so as to reflect the logic state of its memory cell, and having a plurality of bit lines and word lines for accessing a particular memory cell, a dummy cell arrangement for sensing the state of an accessed memory cell, comprising:
   a dummy cell having a dummy capacitor of substantially the same given size as a memory cell capacitor and adapted to be precharged to a selected voltage level;
   means for selectively coupling the dummy capacitor to first and second bit lines such that the capacitance associated with the dummy capacitor effects substantially equal transfers of charge between the first and second bit lines and the dummy capacitor, thereby imparting substantially equal voltage changes to the first and second bit lines;
   means for selectively coupling the capacitor associated with the accessed memory cell to a third bit line so as to effect a transfer of charge between the latter bit line and the memory cell capacitor for changing the voltage on the third bit line; and
   means for sensing a difference in voltage between the third bit line and one of the first and second bit lines so as to determine the logic state associated with the selected memory cell.

2. A dummy cell arrangement as set forth in claim 1 wherein the memory includes a plurality of word lines and a plurality of dummy word lines, wherein the memory cell capacitor associated with the accessed memory cell is coupled to said third bit line in response to a signal of a given level being applied to a selected one of the word lines, and wherein the dummy cell capacitor is coupled to the first and second bit lines in response to a signal of substantially the same given level being applied to a selected one of the dummy word lines such that the dummy capacitor and the memory capacitor transfer equal values of charge between their respective word lines and bit lines when said signals are applied to the selected word line and to the selected dummy word line.

3. A dummy cell arrangement as set forth in claim 1 wherein said sensing means includes a sense amplifier coupled to said first and third bit lines and responsive to a latch signal for latching in a state representative of the voltage difference between said first and third bit lines, wherein the memory includes a plurality of dummy word lines, wherein the dummy cell capacitor is adapted to be coupled and decoupled from the first and second bit lines in response to high and low level dummy word line signals applied to a selected one of the dummy word lines, and wherein the dummy word line signals are adapted to decouple the dummy cell capacitor from the first and second bit lines no sooner than the latch signal is applied to the sense amplifier.

4. A dummy cell arrangement as set forth in claim 1 wherein said first and second bit lines have corresponding first and second bit line capacitances of unequal value, and wherein the dummy capacitor is coupled to the first and second bit lines so as to cause equal charging currents to flow between said first and second bit lines and the dummy capacitor irrespective of the inequality between said bit line capacitances.

5. A dummy cell arrangement as set forth in claim 4 wherein said means for coupling the dummy capacitor to the first and second bit lines includes a first transistor serially coupled between the dummy capacitor and the first bit line and a second transistor serially coupled between the dummy capacitor and the second bit line, and means for energizing said first and second transistors such that they operate as substantially constant current sources.

6. In an MOS memory having a plurality of memory cells each having a memory cell capacitor of a given size which is adapted to be charged so as to reflect the logic state of its memory cell, and having a plurality of bit lines for accessing a particular memory cell, a dummy cell arrangement for sensing the state of an accessed memory cell, comprising:
   a plurality of sense amplifiers, each of which is coupled to two pairs of bit lines so as to sense potentials on a selected one of either of the pairs of bit lines to which it is coupled, and to latch in a logic state indicative of the difference between the potentials on the sensed pair of bit lines;
   means for selectively coupling the memory cell capacitor associated with the accessed memory cell to one bit line sensed by first sense amplifier so as to effect a transfer of charge between said one bit line and the memory cell capacitor;
   a plurality of dummy cells each having a dummy capacitor of substantially the same given size as a memory cell capacitor and each adapted to be precharged to a selected voltage level; and
   means for selectively coupling a selected dummy cell capacitor to the other of the bit lines sensed by said first sense amplifier, and to another bit line which is coupled to another sense amplifier, such that the selected dummy capacitor appears as half said given value to each of the two bit lines to which it is coupled and said first sense amplifier detects a resultant difference in voltage between its sensed bit lines and latches in a state indicative of that difference.

7. A dummy cell arrangement as set forth in claim 6 wherein the memory includes a plurality of dummy word lines and precharge lines, wherein each dummy cell includes a first transistor which is serially coupled between the dummy capacitor and an associated bit line and which is coupled via its gate to a dummy word line, a second transistor which is serially coupled between the dummy cell capacitor and another associated bit line and which is coupled via its gate to the latter dummy word line, and a third transistor which is coupled between a precharge line and the dummy capacitor, such that a signal applied to the precharge line turns one said third transistor for precharging the dummy capacitor, and a signal applied to said dummy word line turns on said first and second transistors for coupling the dummy capacitor to its associated bit lines.

8. A dummy cell arrangement as set forth in claim 6 wherein the memory includes a plurality of word lines and a plurality of dummy word lines, wherein a memory cell capacitor is coupled to one of the bit lines being sensed by said first sense amplifier in response to a signal of a given level being applied to a selected word line, and wherein a selected dummy cell capacitor is coupled to the other bit line being sensed by said first sense amplifier in response to a signal of substantially the same given level being applied to a selected dummy word line such that the dummy capacitor and the memory cell capacitor transfer equal values of charge between their respective word lines and the sensed bit lines when said signals are applied to the selected word line and to the selected dummy word line.

9. A dummy cell arrangement as set forth in claim 6 wherein each sense amplifier receives a latch signal to enable it to latch in one of its two states, wherein the memory includes a plurality of dummy word lines, wherein each dummy cell capacitor is adapted to be coupled and decoupled from a pair of bit lines in response to high and low level dummy word line signals applied to a selected dummy word line, and wherein the dummy word line signals are adapted to decouple each dummy cell capacitor from the latter bit lines no sooner than the latch signal is applied to the selected sense amplifier.

10. In an MOS memory having a plurality of memory cells each having a memory cell capacitor of a given size which is adapted to be charged so as to reflect the logic state of its memory cell, and having a plurality of word lines and bit lines for accessing a particular memory cell, a dummy cell arrangement for sensing the state of an accessed memory cell, comprising:

a plurality of sense amplifiers, each of which is coupled to two pairs of bit lines so as to sense potentials on a selected one of either of the pair of bit lines to which it is coupled, and each of which receives a latch signal to enable it to latch in one of two logic states indicative of the difference between the potentials on the sensed pair of bit lines;

means for coupling the capacitor associated with the accessed memory cell to one of the bit lines being sensed by a first sense amplifier in response to a signal of a given level being applied to a selected word line so as to effect a transfer of charge between said one bit line and the memory cell capacitor;

a plurality of dummy word lines;

a plurality of dummy cells each having a dummy capacitor of substantially the same given size as a memory cell capacitor and adapted to be precharged to a selected voltage level;

means for coupling a selected dummy cell capacitor to the other of the bit lines sensed by said first sense amplifier and to another bit line which is coupled to another sense amplifier in response to a dummy word line signal of said given level being applied to a selected dummy word line such that the selected dummy capacitor and the memory cell capacitor transfer equal values of charge between their respective word lines and the sensed bit lines and such that the selected dummy capacitor appears as half said given value to each of the two bit lines to which it is coupled, and said dummy word line signal being selected to assume another level no sooner than the latch signal is applied to said first sense amplifier for decoupling the selected dummy capacitor from the sensed bit line.

* * * * *